United States Patent
Bell et al.

(10) Patent No.: US 6,551,711 B1
(45) Date of Patent: Apr. 22, 2003

(54) CURABLE EPISULFIDE SYSTEMS HAVING ENHANCED ADHESION TO METAL

(75) Inventors: James P. Bell, Storrs, CT (US); Katsuyuki Tsuchida, Storrs, CT (US)

(73) Assignee: The University of Connecticut, Storrs, CT (US)

( * ) Notice: Subject to any disclaimer, the term of this patent is extended or adjusted under 35 U.S.C. 154(b) by 4 days.

(21) Appl. No.: 09/660,938

(22) Filed: Jun. 19, 2000

Related U.S. Application Data

(60) Provisional application No. 60/140,104, filed on Jun. 18, 1999.

(51) Int. Cl.$^7$ ............................................. B32B 27/38
(52) U.S. Cl. ..................... 428/413; 428/413; 428/457; 428/461; 307/147; 174/250; 174/255; 174/256; 174/253; 477/383; 477/386; 477/388.1
(58) Field of Search ................................. 428/413, 418, 428/457, 461; 307/147; 174/250, 255, 256, 253; 477/383.1, 386, 388.1

(56) References Cited

U.S. PATENT DOCUMENTS

| | | | |
|---|---|---|---|
| 4,256,594 A | * | 3/1981 | Rysek |
| 4,596,644 A | * | 6/1986 | Banks |
| 5,266,701 A | * | 11/1993 | Woolard ..................... 548/199 |
| 5,374,668 A | * | 12/1994 | Kanemura .................. 523/451 |
| 6,165,617 A | * | 12/2000 | Satoh ......................... 428/418 |

* cited by examiner

Primary Examiner—Leszek Kiliman
(74) Attorney, Agent, or Firm—Cantor Colburn LLP

(57) ABSTRACT

A metal-polymer composite comprises a metal and substrate layer disposed on the metal, wherein the substrate layer is formed from a curable thermosetting resin system comprising a curing agent and about 0.1 to 100 weight percent (wt %), preferably about 0.2 to about 80 wt %, more preferably about 0.4 to about 60 wt %, and most preferably about 2 to about 40 wt % of an episulfide, and further wherein the resin system is cured in the presence of the metal. In another embodiment, the thermosetting system comprises about 0.1 to about 50 wt %, preferably about 1 to about 40 wt % and more preferably about 2 to about 30 wt % of at least one episulfide resin, at least one epoxy resin reactive therewith, and a curing agent, wherein the resin system is cured in the presence of a metal, such as a layer of copper or gold. A preferred epoxy resin is the diglycidyl ether of bisphenol A, which is the condensation product of bisphenol A and epichlorohydrin (hereinafter abbreviated "DGEBA"). A preferred episulfide resin is the episulfide analog of the preferred epoxy resin.

The two aforementioned thermosetting resin systems find particular utility as protective coatings and adhesives for metals, as well as cured compositions, preferably laminated to metals, to form, for example circuit boards.

39 Claims, 4 Drawing Sheets

—□— Epon 828 (100 wt)/DICY (5 wt)/BDMA (1 wt)
—○— Epon 828 (100 wt)/episulfide 828 (10 wt)/DICY (5 wt)/BDMA (1 wt)

CURABLE EPISULFIDE SYSTEMS HAVING ENHANCED ADHESION TO METAL

CROSS REFERENCE TO RELATED APPLICATIONS

This application claims priority to provisional application Serial No. 60/140,104 filed on Jun. 18, 1999 which is incorporated by reference herein.

BACKGROUND OF THE INVENTION

1. Field of the Invention

This invention relates to resins having enhanced adhesion to metal. In particular, this invention relates to curable episulfide and episulfide/epoxy resins having enhanced adhesion to metals such as copper, gold, and the like. These resins find particular utility in the formation of circuit board laminates, as protective coatings and adhesives.

2. Description of the Related Art

Epoxy resins are widely used for protective coating, electrical, and adhesive applications, due to their high chemical and corrosion resistance, good mechanical and electrical properties, and strong adhesion to many different substrates, especially metals.

The electronics industry depends upon fiberglass reinforced epoxy resin circuit boards. These circuit boards comprise a fiberglass reinforced epoxy resin dielectric layer adhered to an electrically conductive layer, typically copper. Technological advances have resulted in increasing demands on circuit boards. Properties such as dimensional stability, residual stresses and coefficient of thermal expansion (CTE) are particularly important. Additionally, the fiberglass reinforced epoxy resin dielectric layer must remain adhered to the electrically conductive layer, as separation of the dielectric layer from the electrically conductive layer results in board failure.

Because metals are subject to corrosion problems, many protective treatments have been developed, such as metal plating, chromate, corrosion inhibitors, and coupling agents. Some of these treatments also promote adhesion of another substance to the metal. Protective treatments are usually applied before the metal is used. In general, these corrosion-resistance and/or adhesion-promoting treatments are relatively expensive, complicated and in some instances, harmful to the environment. Epoxy resins are an attractive alternative to the previously mentioned treatments and are widely used for protective coatings to provide corrosion protection to metals.

Typical epoxy resins show excellent initial adhesion to several common metals but adhesion after water exposure is poor. In circuit boards this loss of adhesion results in board failure. In protective coatings the loss of adhesion means the loss of protection. Additionally, one of the most widely used epoxy/curative systems, epoxy/DICY, has a relatively long pot life and prepreg storage life but an undesirably high cure temperature and long cure time. As a result, an accelerator is typically added to reduce the cure temperature and time but the accelerator concurrently reduces the pot life and prepreg storage life. As a result the prepreg must be stored below room temperature and in low humidity conditions. Special storage conditions results in increased manufacturing costs.

Accordingly, there remains a need in the art for resin systems with more durable metal adhesion, long pot life and long prepreg storage life.

SUMMARY OF THE INVENTION

The above-discussed and other drawbacks and deficiencies of the prior art are overcome or alleviated by a metal-polymer composite comprising a metal and substrate layer disposed on the metal, wherein the substrate layer is formed from a curable thermosetting resin system comprising a curing agent and about 0.1 to 100 weight percent (wt %), preferably about 0.2 to about 80 wt %, more preferably about 0.4 to about 60 wt %, and most preferably about 2 to about 40 wt % of an episulfide, and further wherein the resin system is cured in the presence of the metal. In another embodiment, the thermosetting system comprises about 0.1 to about 50 wt %, preferably about 1 to about 40 wt % and more preferably about 2 to about 30 wt % of at least one episulfide resin, at least one epoxy resin reactive therewith, and a curing agent, wherein the resin system is cured in the presence of a metal, such as a layer of copper or gold. A preferred epoxy resin is the diglycidyl ether of bisphenol A, which is the condensation product of bisphenol A and epichlorohydrin (hereinafter abbreviated "DGEBA"). A preferred episulfide resin is the episulfide analog of the preferred epoxy resin.

The two aforementioned thermosetting resin systems find particular utility as protective coatings and adhesives for metals, as well as cured compositions, preferably laminated to metals, to form, for example circuit boards.

The above discussed and other features and advantages will be appreciated and understood by those skilled in the art from the following detailed description and drawings.

BRIEF DESCRIPTION OF THE DRAWINGS

Referring now to the exemplary drawings wherein like elements are numbered alike in the several FIGURES.

DETAILED DESCRIPTION OF THE PREFERRED EMBODIMENTS

Figure 1:
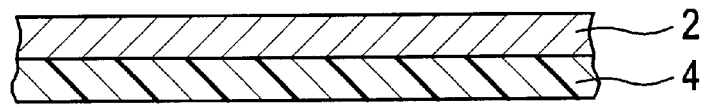
FIG. 1 is a schematic representation of a circuit board material.

The curable thermosetting resin system comprises a curing agent and about 0.1 to 100 weight percent (wt %), preferably about 0.2 to about 80 wt %, more preferably about 0.4 to about 60 wt %, and most preferably about 2 to about 40 wt % by weight an episulfide resin, wherein the resin system is cured in the presence of a metal. In another embodiment, the curable thermosetting system comprises about 0.1 to about 50 wt %, preferably about 1 to about 40 wt % and more preferably about 2 to about 30 wt % of at least one episulfide resin, at least one epoxy resin reactive therewith, and a curing agent, wherein the resin system is cured in the presence of a metal, such as a layer of copper or gold. A preferred epoxy resin is the diglycidyl ether of bisphenol A, which is the condensation product of bisphenol A and epichlorohydrin (hereinafter abbreviated "DGEBA"). A preferred episulfide resin is the episulfide analog of the preferred epoxy resin. The composition can further comprise additives and fillers as is conventional in the art.

The thermosetting resin system has essentially the same dielectric constant as the analogous standard epoxy resins but has significant advantages with regard to other important properties. The advantageous properties are higher tensile strength, lower heat of reaction which results in low cure shrinkage, lower coefficient of thermal expansion than analogous epoxy resins, improved toughness, increased glass transition temperature, longer pot life and longer prepreg storage life. In addition to these improved bulk properties, the resin system cured in the presence of metal demonstrates improved metal/resin adhesion and corrosion resistance.

Episulfides are sulfur analogs of epoxides wherein the oxygen of the oxirane ring is replaced by sulfur. The sulfur substitution has significant impact on the reactive characteristics of the resulting molecule compared to the epoxide parent. Episulfide resins may be synthesized directly from epoxy resins. In an exemplary process, the epoxy resin is combined with a reactive sulfur species, such as thiourea or N-methylbenzothiazol-2-thione (NMBTT), in a suitable solvent and allowed to react, typically at room temperature, effecting an exchange of oxygen for sulfur in the oxirane ring as shown below in Equation (I).

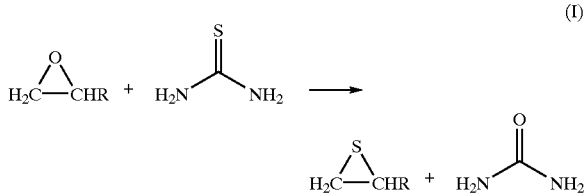

Alternatively, the epoxy resin may serve as solvent in episulfide resin synthesis. After the reaction is complete the mixture is subjected to a procedure such as aqueous extraction to remove any remaining active sulfur species. If the epoxy resin was present as reactant and solvent, the resulting solution contains a mixture of epoxy and episulfide resins. In this case the resulting solution may be used as formed. If the isolated episulfide resin is desired, episulfide resin may be isolated known methods, for example aqueous extraction and solvent removal.

Epoxy resins are well known. Suitable resins include one, two, three, four, or more epoxy functional groups. Epoxy resins are thus characterized by the presence of at least one epoxy group and can have aromatic, aliphatic, and cycloaliphatic backbones. Examples of useful epoxy resins include but are not limited to, bisphenol A epoxy resins, bisphenol F epoxy resins, bisphenol S epoxy resins, phenol novolak epoxy resins, cresol novolak epoxy resins, bisphenol A novolak epoxy resins, salicylaldehyde novolak epoxy resins, bisphenol F novolak resins, alicyclic epoxy resins, glycidyl ester epoxy resins, glycidylamine epoxy resins, hydration epoxy resins, isocyanurate epoxy resins, aliphatic cyclic epoxy resins, halides thereof, hydrides thereof, and mixtures thereof.

The choice of reactive sulfur species and optional solvent is dependent upon the structure of the epoxide and is readily determined by one of ordinary skill in the art without undue experimentation. A wide variety of epoxides may be reacted with a suitable reactive sulfur species to obtain the corresponding episulfide.

A preferred episulfide resin has the structure (II) shown below,

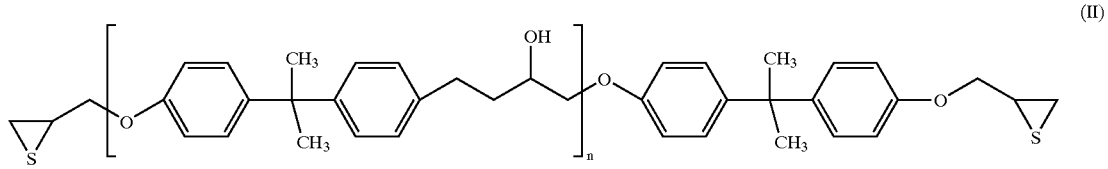

wherein n is about 0.15 to about 1.0. The thermosetting composition may comprise more than one episulfide resin.

Epoxy resins are typically synthesized by one of two methods. The first method is by reaction between a compound with one or more active hydrogen group(s), for example a carboxylic acid or an alcohol such as bisphenol A, and epichlorohydrin. The product of this reaction is a diglycidyl ether of the compound with the active hydrogen group. This method is especially useful for producing multifunctional epoxy resins. It can produce low molecular weight resins or high molecular weight resins. Low molecular weight epoxy resins are useful as intermediates for the chain extension reaction to produce high molecular weight resins. The chain extension reaction, also known as the advancement or fusion process, reacts the low molecular weight epoxy resin with an active hydrogen compound such as bisphenol A to produce a high molecular weight resin.

A second method to produce epoxy resins is direct epoxidation of olefins by peracids. This method has broad utility and is especially useful in the production of cycloaliphatic epoxy resins. Further information regarding the synthesis of epoxy resins may be found in *Concise Encyclopedia of Polymer Science and Engineering* edited by Jacqueline I. Kroschwitz, pages 344–349, which is incorporated by reference herein.

A preferred epoxy resin is the diglycidyl ether of bisphenol A, which is the condensation product of bisphenol A and epichlorohydrin. This epoxy resin is commercially available from Shell Chemical Co under the trade names EPON® and Eponex. Epoxy resins preferably comprise about 1 to about 99 wt % of the thermosetting resin system, with about 10 to about 90 wt % preferred and about 20 wt % to about 80 wt % especially preferred.

Useful curing agents include all conventional curing agents used with epoxy resins. Exemplary curing agents are primary or secondary amines and salts thereof. The choice of curing agent depends upon the desired rate of cure. The speed of cure decreases with decreasing basicity of the amine and increasing steric hindrance. Preferred curing agents include polyamide curing agents such as VERSAMID® 140 available from the Miller Stephenson Chemical Co. and V-15®, V-40® and V-50® available from Shell Chemical Co. Another preferred curing agent is dicyandiamide (DICY). When DICY is used as a curing agent, the amount of curing agent is about 2 wt % to about 15 wt % of the thermosetting resin system, with about 5 wt % to about 12 wt % preferred. All other curing agents are used in amounts of about 5 wt % to about 50 wt % of the thermosetting resin system with about 10 wt % to about 40 wt % preferred.

The thermosetting may further comprise a curing accelerator. As the curing accelerator, there can be used conventional imidazoles, organic phosphorus compounds, tertiary amines, quaternary ammonium salts. A preferred curing accelerator, generally used in combination with DICY is N,N-dimethylbenzylamine (BDMA). The curing accelerator can be used in amounts of about 0.01 to 20 wt % of the thermosetting resin system, more preferably 0.1 to 1.0 wt %.

Metals which may be present during cure include copper, aluminium, gold, silver, nickel, zinc, platinum, palladium, cadmium, iron and alloys containing at least one of the foregoing. Aluminum, copper, alloys of aluminum and alloys of copper are preferred. The metal may be any desired shape, from a simple sheet to a complex three dimensional article.

The thermosetting system may further contain fillers and reinforcing agents. Examples of preferred fillers include titanium dioxide (rutile and anatase), barium titanate, strontium titanate, silica (particles and hollow spheres) including fused amorphous silica, corundum, wollastonite, aramide fibers (e.g., Kevlar), fiberglass, $Ba_2Ti_9O_{20}$, glass spheres, quartz, boron nitride, aluminum nitride, silicon carbide, beryllia, alumina or magnesia carbon black, graphite used alone or in combination. Particularly preferred fillers are rutile titanium dioxide and amorphous silica because these fillers have a high and low dielectric constant, respectively, thereby permitting a broad range of dielectric constants combined with a low dissipation factor achievable in the final cured product by adjusting the respective amounts of the two fillers in the composition. To improve adhesion between the fillers and resin, coupling agents, e.g., silanes, may be used. Other useful additives are mold release agents, UV absorbers, stabilizers such as light stabilizers and others, lubricants, plasticizers, pigments, dyes, colorants, anti-static agents, blowing agents, flame retardants, impact modifiers, among others. These types of additives and their use is well known in the art and useful amounts are readily determined based upon the desired characteristics of the final composition.

The thermosetting resin systems are generally handled by conventional methods. The epoxy resin, when present, may serve as the solvent, or an optional solvent may be employed. The episulfide resin, optional epoxy resin, optional solvent, curing agent, optional curing accelerator as well as additives and filler, when present, are stirred until completely mixed. After applying the thermosetting resin system or forming it into the desired shape, the thermosetting resin system is then cured. Generally, cure temperatures are room temperature to about 250° C. Typically, when DICY is the curing agent the material is cured at 100° C. for an hour although it may also be subsequently heated to 150° C. over 15 minutes, and cured at 150° C. for an hour. When the curing agent is a polyamide the thermosetting resin system may be cured at room temperature. Gelation can be as fast as 2 minutes, depending on the amount of episulfide resin used in conjunction with the polyamide. Episulfide resin greatly accelerates curing. The dependency of curing time and temperature on curing agent is a well-known phenomenon and as such suitable curing times and temperatures are readily determined by one of ordinary skill in the art.

Without being bound by theory, it is believed that the improved adhesion is due to chemical bonding between the sulfur ions generated during the curing process. The improved metal adhesion and the improved bulk resin properties may be due to the relative reactivities of the episulfide and epoxide and to the presence of different homo and hetero polymers after cure. During cure the three membered rings of the epoxide and episulfide are subjected to nucleophilic attack, initially by the curing agent only and subsequently by the curing agent and reactive products of the initial nucleophilic attack. The episulfide terminal ring is more reactive than the epoxide terminal ring. As a result the episulfide ring reacts more readily with the curing agent. The product of that reaction is a stable, delocalized $RS^-$ ion (R is defined as the remainder of the episulfide molecule). The $RS^-$ ion can attack an episulfide molecule, an epoxy molecule, or the metal. The $RS^-$ ion readily reacts with metals such as copper to form a covalent bond, even at room temperature. The RS—Cu copper bonds provide improved adhesion and corrosion resistance. The presence of the Cu—S—C bond has been proven by x-ray photospectroscopy (XPS).

Figure 2:
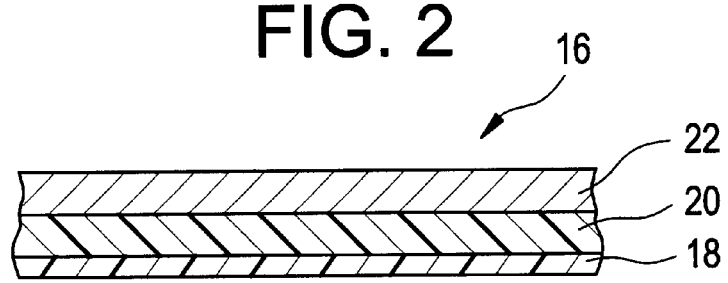
FIG. 2 is a schematic representation of a circuit board material.

The metal-polymer composite may be used in a variety of applications. One embodiment is circuit board material. Circuit board materials are well-known in the art, generally comprising a thermosetting substrate adhered to a conductive metal surface. The thermosetting resin system of the metal-polymer composite may comprise either the thermosetting substrate or an intervening adhesive layer disposed between the thermosetting substrate and conductive metal surface to improve the peel strength of the resulting circuit board material. FIG. 1 shows a circuit board material comprising a conductive metal surface and a thermosetting substrate 4. FIG. 2 shows a circuit board material comprising a conductive layer 22 with an adhesive layer 20 and a thermosetting substrate 18.

The thermosetting resin system is further useful as a general adhesive, especially for adhering a metal surface to a second surface especially when the second surface is a metal.

Finally, the thermosetting resin system is useful on metals as a protective coating, especially against corrosion. The metal-polymer composite formed by coating a metal with the thermosetting resin system is extremely resistant to corrosive conditions such as salt spray.

Application of the thermosetting resin system to the metal to form the metal-polymer composite can be accomplished by any method known in the art such as spin brush, spray, dip, or wash coating. Choice of application method is reliant upon the viscosity of the thermosetting resin system although the viscosity may be altered by the use of a suitable solvent. After application the metal-polymer composite may be dried under ambient conditions or by forced or heated air prior to curing. Drying and curing can occur concurrently. Generally when the thermosetting resin system is disposed between the metal and another material, the thermosetting resin system is applied to the metal, optionally dried, disposed adjacent the other material and cured.

The invention is further illustrated by the following non-limiting Examples.

EXAMPLES

The materials shown in Table 1 were used.

TABLE 1

| Trade Name | Source | Material |
| --- | --- | --- |
| EPON 828 | Shell Chemical Co. | Epoxy resin |
| V-40 | Shell Chemical Co. | Polyamide curing agent |
| Thiourea | Aldrich Chemical Co. | Episulfide synthesis |
| Dicyandiamide (DICY) | Aldrich Chemical Co. | Curing agent |
| N,N-dimethylbenzylamine (BDMA) | Aldrich Chemical Co. | Curing accelerator |

The episulfide resin used in the following examples was synthesized by dissolving 50 g of EPON 828 in 300 milliliters (ml) of methanol. 37.2 g of thiourea was dissolved in 300 ml of methanol to form a solution. The thiourea solution was then added dropwise to the EPON 828 solution over 45 minutes. The mixture was then stirred for 12 hours at room temperature, poured into 250 milliliters of cold, distilled water and allowed to stand for 2 hours. The resulting white precipitate was washed three times with a methanol/water mixture (2/1 ratio by volume) and air dried. The white solid was then dissolved in 300 ml of methylene chloride, washed three times with distilled water and dried over anhydrous magnesium chloride for about 6 hours. The solvent was removed under reduced pressure at 40–45° C. and then dried under vacuum overnight.

Samples were made according to the formulations shown in Table 2.

TABLE 2

| Material | 1* | 2* | 3 | 4 | 5 | 6 | 7 | 8 | 9 |
| --- | --- | --- | --- | --- | --- | --- | --- | --- | --- |
| EPON 828 | 94 | 50 | 94 | 86 | 83 | 40 | 30 | 25 | 20 |
| Episulfide | — | — | 4.5 | 9 | 12 | 20 | 30 | 50 | 60 |
| DICY | 5 | — | 4.5 | 4 | 4 | — | — | — | — |
| BDMA | 1 | — | 1 | 1 | 1 | — | — | — | — |
| V-40 | — | 50 | — | — | — | 40 | 30 | 25 | 20 |

*Comparative Examples

Adhesion

Figure 3A:
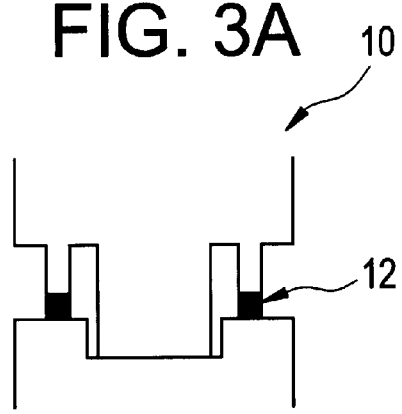
FIGS. 3a and b are schematic representations of a torsional butt joint.
Figure 3B:
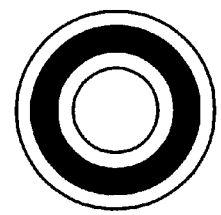
Figure 3B:
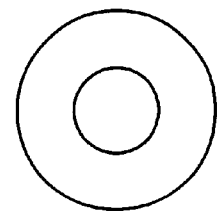
Figure 4:
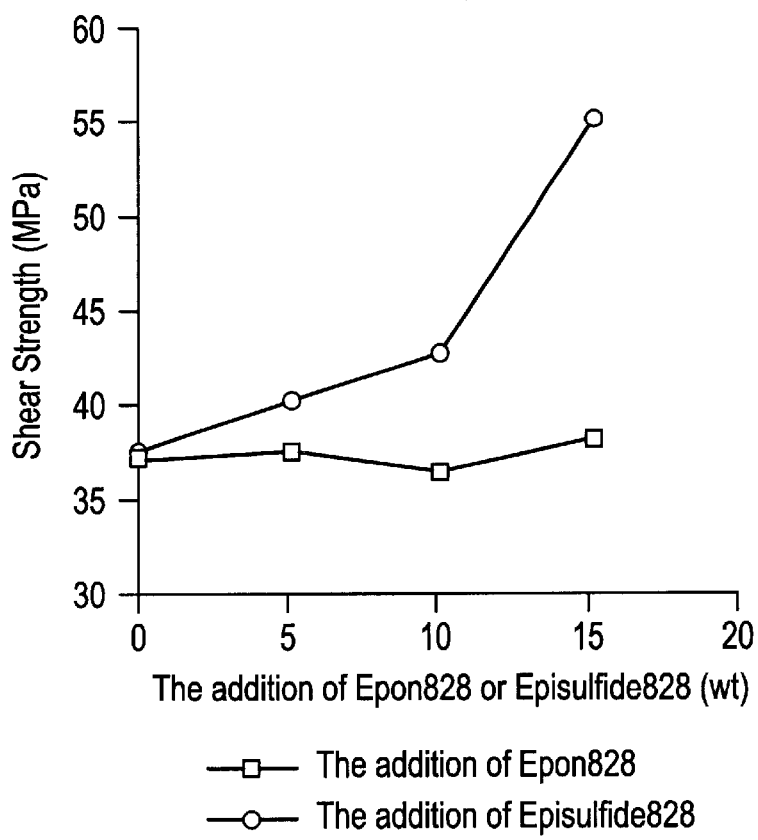
FIG. 4 is a graph comparing shear strength to episulfide content.
Figure 5:
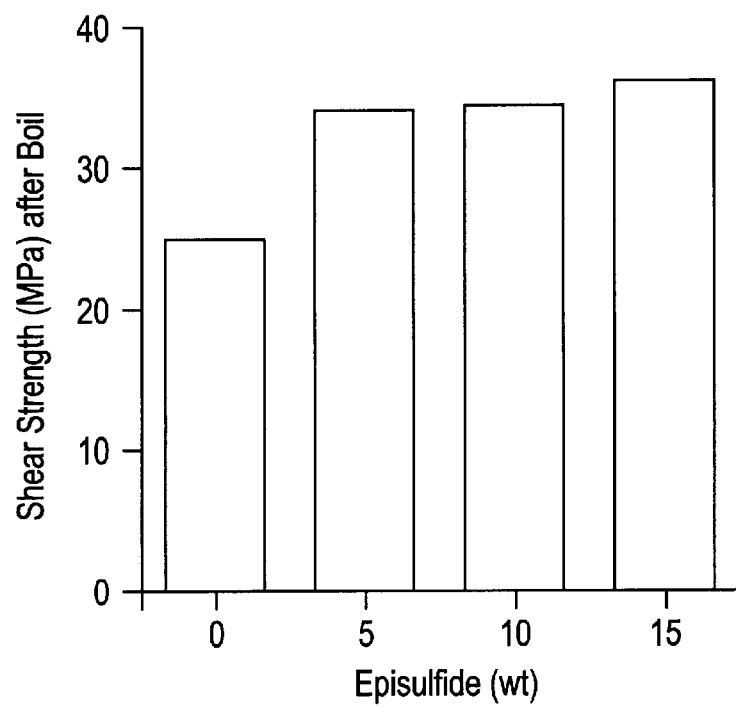
FIG. 5 is a graph comparing shear strength after boil to episulfide content.
Figure 6:
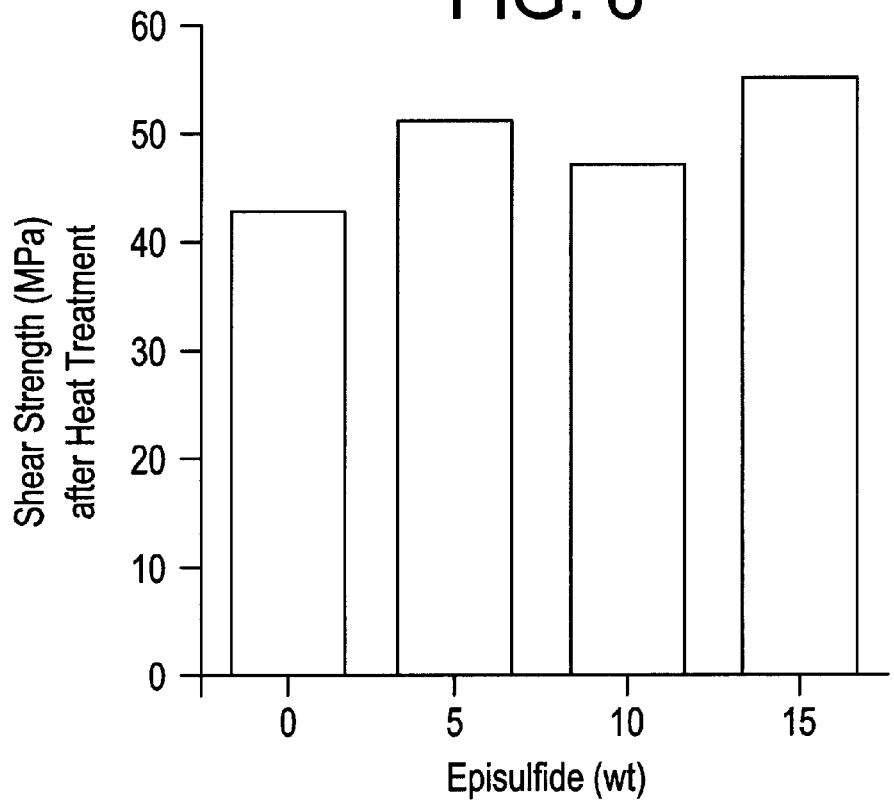
FIG. 6 is a graph comparing shear strength after heat exposure to episulfide content.

Adhesion was tested according to the method described by J. Bell and C. J. Lin, J. Applied Polym. Sci., Vol. 16, page 1721 which is incorporated by reference herein. Copper torsional joints were machined and polished, washed with ethanol, immersed in a 3 weight percent solution of sulfuric acid for 1 minute then washed with distilled water. Approximately 44 mg of samples prepared according to formulations 1 and 3–5 was used to make modified tubular butt joints 10 as shown in FIG. 3a with the thermosetting resin portion 12. The joint assemblies were cured at 100° C. for 1 hour. The temperature was elevated to 150° C. over 15 minutes. The joint assemblies were then cured at 150° C. for 1 hour. Joint assemblies were tested for shear strength as made, after immersion in boiling water for eight hours, and after heating at 175° C. for 2 days. Shear strength was tested using an Instron Universal Testing Machine, Model TM-S. Torque was applied using an Instralab torsional device from Instron Engineering Co. A 1,000 lb reversible load cell was used to measure the force at break. The cross head speed was 0.2 inches/minute. Results are shown in FIGS. 4–6. In all cases, the addition of episulfide improves the shear strength and hence, the adhesion to the copper.

Tg and Coefficient of Thermal Expansion (CTE)

Figure 7:
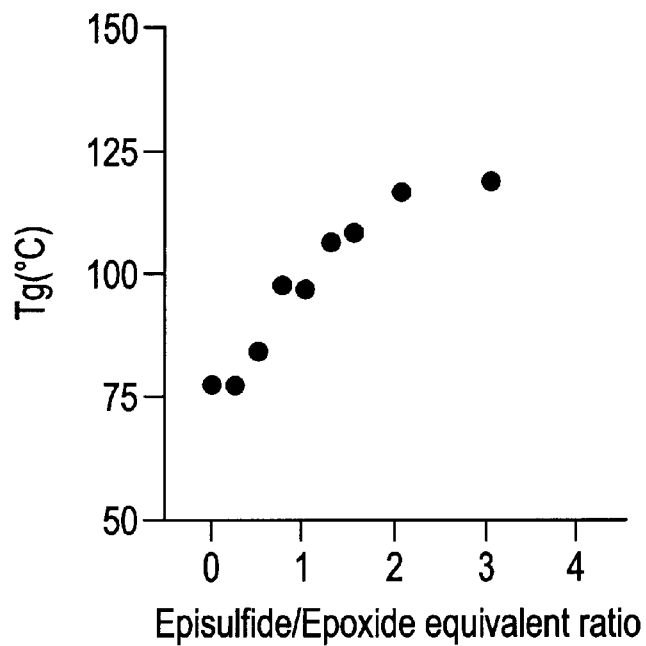
FIG. 7 is a graph comparing glass transition temperature to episulfide content.
Figure 8:
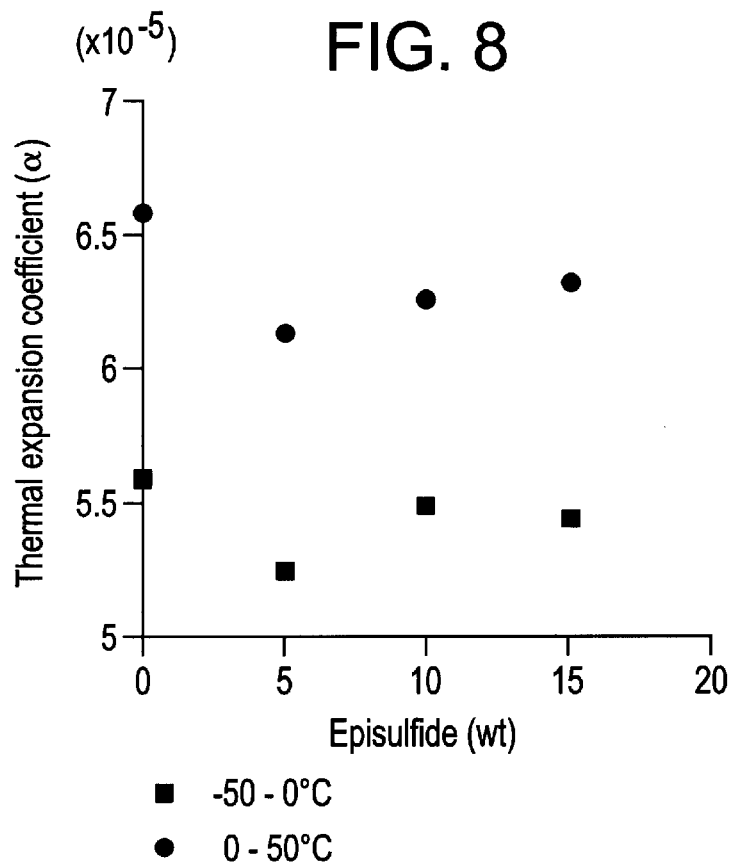
FIG. 8 is a graph comparing the coefficient of thermal expansion to episulfide content.

Samples were prepared according to formulations 2 and 7–9 were loaded into 1 cubic centimeter polypropylene syringes and cured as described above. The samples were analyzed by Differential Scanning Calorimetry (DSC) for Tg and heat of reaction. Results are shown in FIG. 7. Samples for CTE analysis, prepared according to formulations 1 and 3—5, were formed in the same manner as for Tg testing. The cured samples were cut to size (5) millimeter diameter and 6.7 millimeter height) and analyzed by Thermal Mechanical Analysis for CTE. Results are shown in FIG. 8. The Tg of the epoxy/episulfide resin system is significantly higher than the Tg of the epoxy resin system. The addition of episulfide clearly improves (lowers) the CTE of the resin system compared to the epoxy system.

Prepreg Storage Life

Figure 9:
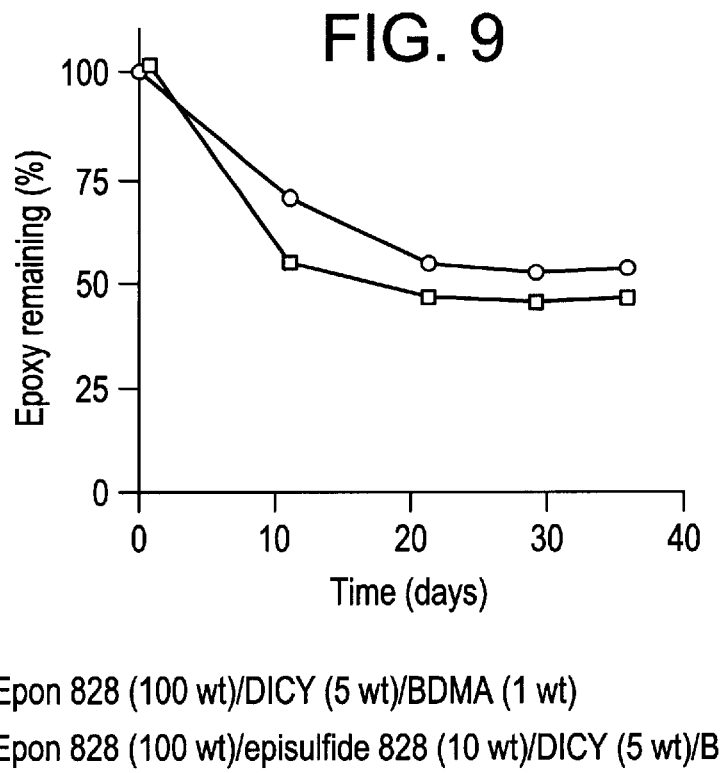
FIG. 9 is a graph depicting percent of remaining epoxide as a function of time.

Samples prepared according to formulations 1 and 4 were cured at 100° C. for 1 hour, then stored at room temperature. Samples were analyzed by near IR as a function of time as shown in FIG. 9. After curing at 100° C. for 1 hour, approximately 60% of the epoxy ring remains in both systems and approximately 30% of the episulfide ring remains in the epoxy/episulfide system. The standard epoxy system gradually polymerizes and has completely reacted at room temperature after 50 days. On the other hand, in the epoxy/episulfide system, the reaction is slower and only 10–20% of the remaining epoxy reacted at room temperature after 50 days. Therefore, the epoxy-episulfide system is expected to have a longer prepreg storage life than the standard epoxy.

Corrosion Resistance

The corrosion resistance of a copper substrate coated with formulations 2 and 6 was measured by a standard salt spray test (ASTM B-117). The copper was coated by spin coating to a thickness of about 3 microns with a 33 weight percent solution of the thermosetting resin system in cyclohexanone. The coated copper samples were cured at 100° C. for 1 hour, 60° C. for 1 hour and at room temperature for 53 days. Table 3 contains the results of corrosion of the coated copper after the salt spray test. While the exposure time was long and corrosion was observed on all samples, samples according to formulation 6, the epoxy/episulfide system shows much improved corrosion resistance on copper as compared to the standard epoxy system. Samples with higher curing temperature show better corrosion resistance.

TABLE 3

| Formulation | Curing Conditions | 7 days | 14 days | 53 days |
| --- | --- | --- | --- | --- |
| 2 | 100° C. | 4- | 3 | 2 |
| 2 | 60° C. | 1 | 1 | 1 |
| 2 | Room temp. | 1 | 1 | 1 |
| 6 | 100° C. | 5 | 4 | 4- |
| 6 | 60° C. | 4 | 3 | 3- |
| 6 | Room temp. | 3 | 2 | 2 |

5: excellent (no oxidation), 4: very good (slight spot oxidation), 3: fair (partially oxidized), 2: poor (mostly oxidized), 1: very poor (fully oxidized)

While preferred embodiments have been shown and described, various modifications and substitutions may be made thereto without departing from the spirit and scope of the invention. Accordingly, it is to be understood that the present invention has been described by way of illustration and not limitation.

What is claimed is:

1. A metal-polymer composite comprising:
   a metal; and
   a substrate layer disposed on the metal, wherein the substrate layer is formed from a curable thermosetting resin system comprising a curing agent, about 0.1 to 100 weight percent of an episulfide resin, cured in the presence of the metal.

2. The metal-polymer composite of claim 1 wherein the cured thermosetting resin system further comprises an epoxy resin.

3. The metal-polymer composite of claim 2 wherein the epoxy resin comprises at least one epoxide group and an aromatic, aliphatic or cycloaliphatic backbone.

4. The metal-polymer composite of claim 3 wherein the epoxy resin is selected from the group consisting of bisphenol A epoxy resins, bisphenol F epoxy resins, bisphenol S epoxy resins, phenol novolak epoxy resins, cresol novolak epoxy resins, bisphenol A novolak epoxy resins, salicylaldehyde novolak epoxy resins, bisphenol F novolak resins, alicyclic epoxy resins, glycidyl ester epoxy resins, glycidylamine epoxy resins, hydration epoxy resins, isocyanurate epoxy resins, aliphatic cyclic epoxy resins, halides thereof, hydrides thereof, and mixtures thereof.

5. The metal-polymer composite of claim 4 wherein the epoxy resin is the condensation product of bisphenol A and epichlorohydrin.

6. The metal-polymer composite of claim 2 wherein the epoxy resin comprises about 1 wt % to about 99 wt % of the thermosetting resin system.

7. The metal-polymer composite of claim 2 wherein the epoxy resin comprises about 10 wt % to about 90 wt % of the thermosetting resign system.

8. The metal-polymer composite of claim 2 wherein the epoxy resin comprises about 20 wt % to about 80 wt % of the thermosetting resin system.

9. The metal-polymer composite of claim 2 wherein the episulfide resin comprises an episulfide of formula (II)

10. The metal-polymer composite of claim 2 wherein the curing agent is selected from the group consisting of primary and secondary amines.

11. The metal-polymer composite of claim 10 wherein the curing agent is dicyandiamide.

12. The metal-polymer composite of claim 11 wherein the dicyanidiamide comprises about 2 wt % to about 15 wt % of the thermosetting resin system.

13. The metal-polymer composite of claim 10 wherein the curing agent is polyamide.

14. The metal-polymer composite of claim 13 wherein the polyamide comprises about 5 wt % to about 50 wt %.

15. The metal-polymer composite of claim 10 further comprising a curing accelerator.

16. The metal-polymer composite of claim 2 wherein the metal is selected from the group consisting of copper, aluminum, gold, silver, nickel, zinc, platinum, palladium, cadmium, iron and alloys containing at least one of the foregoing.

17. The metal-polymer composite of claim 16 wherein the metal is copper.

18. The metal-polymer composite of claim 2 further comprising additives and fillers.

19. A circuit board material comprising the metal-polymer composite of claim 2.

20. A method for making a metal-polymer composite comprising:
   disposing a thermosetting resin system comprising a curing agent and about 0.1 to 100 weight percent of an episulfide on a metal; and
   curing the thermosetting resin system.

21. The method of claim 20 wherein the thermosetting resin system further comprises an epoxy resin.

22. The method of claim 21 wherein the epoxy resin comprises at least one epoxide group and an aromatic, aliphatic or cycloaliphatic backbone.

23. The method of claim 22 wherein the epoxy resin is selected from the group consisting of bisphenol A epoxy resins, bisphenol F epoxy resins, bisphenol S epoxy resins, phenol novolak epoxy resins, cresol novolak epoxy resins, bisphenol A novolak epoxy resins, salicylaldehyde novolak epoxy resins, bisphenol F novolak resins, alicyclic epoxy resins, glycidyl ester epoxy resins, glycidylamine epoxy resins, hydration epoxy resins, isocyanurate epoxy resins, aliphatic cyclic epoxy resins, halides thereof, hydrides thereof, and mixtures thereof.

24. The method of claim 23 wherein the epoxy resin is the condensation product of bisphenol A and epichlorohydrin.

25. The method of claim 21 wherein the epoxy resin comprises about 1 wt % to about 99 wt % of the thermosetting resin system.

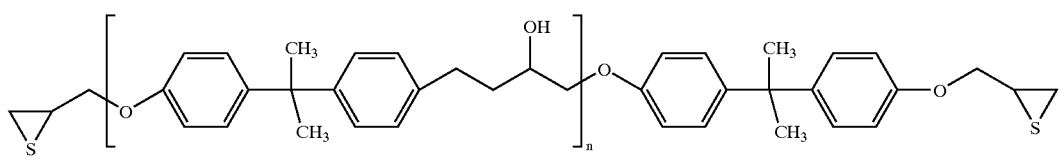

wherein n is equal to about 0.15 to about 1.0.

26. The method of claim 21 wherein the epoxy resin comprises about 10 wt % to about 90 wt % of the thermosetting resign system.

27. The method of claim 21 wherein the epoxy resin comprises about 20 wt % to about 80 wt % of the thermosetting resin system.

28. The method of claim 21 wherein the episulfide resin comprises an episulfide of formula (II)

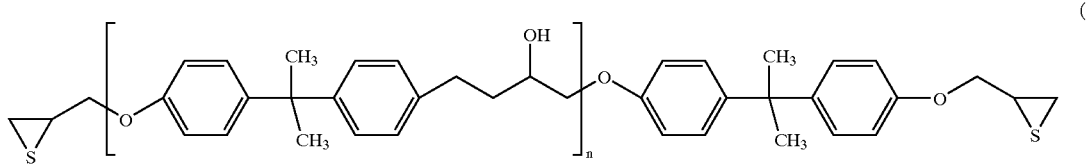

(II)

wherein n is equal to about 0.15 to about 1.0.

29. The method of claim 21 wherein the curing agent is selected from the group consisting of primary and secondary amines.

30. The method of claim 21 wherein the curing agent is dicyandiamide.

31. The method of claim 30 wherein the dicyanidiamide comprises about 2 wt % to about 15 wt %.

32. The method of claim 29 wherein the curing agent is polyamide.

33. The method of claim 32 wherein the polyamide comprises about 5 wt % to about 50 wt %.

34. The method of claim 29 further comprising a curing accelerator.

35. The method of claim 21 wherein the metal is selected from the group consisting of copper, aluminum, gold, silver, nickel, zinc, platinum, palladium, cadmium, iron and alloys containing at least one of the foregoing.

36. The method of claim 35 wherein the metal is copper.

37. The method of claim 21 further comprising additives and fillers.

38. The method of claim 22 wherein the method comprise a circuit board material.

39. A thermosetting resin system comprising episulfide resin, epoxy resin and a dicyandiamide.

* * * * *